United States Patent [19]
Chen

[11] Patent Number: 5,868,278
[45] Date of Patent: Feb. 9, 1999

[54] ELIMINATING MICROBUBBLES IN DEVELOPER SOLUTIONS TO REDUCE PHOTORESIST RESIDUES

[75] Inventor: Yung-Dar Chen, Hsin-Chu Hsien, Taiwan

[73] Assignee: Taiwan Semiconductor Manufacturing Company, Ltd., Hsin-Chu, Taiwan

[21] Appl. No.: 761,884

[22] Filed: Dec. 9, 1996

[51] Int. Cl.[6] .................................................. B67D 5/08
[52] U.S. Cl. .............................. 222/1; 137/205; 137/208; 137/209; 222/61; 222/64; 222/152; 222/394
[58] Field of Search .................................. 222/1, 61, 64, 222/152, 394; 137/205, 208, 209

[56] References Cited

U.S. PATENT DOCUMENTS

| | | | |
|---|---|---|---|
| 4,199,472 | 4/1980 | Rollison | 222/152 X |
| 4,601,409 | 7/1986 | DiRegolo | 222/1 |
| 5,148,945 | 9/1992 | Geatz | 222/61 |
| 5,330,072 | 7/1994 | Ferri, Jr. et al. | 137/205 X |
| 5,347,863 | 9/1994 | Richard | 73/301 |
| 5,490,611 | 2/1996 | Bernosky et al. | 222/64 X |
| 5,607,000 | 3/1997 | Cripe et al. | 137/209 X |
| 5,636,762 | 6/1997 | Juhola et al. | 222/152 X |

*Primary Examiner*—Kevin P. Shaver
*Attorney, Agent, or Firm*—George O. Saile; Stephen B. Ackerman

[57] ABSTRACT

Defects, associated with the presence of microbubbles in the photoresist developer solution, have been largely eliminated by providing an apparatus and method whereby the photoresist developer solution, while on standby status in a buffer tank, is maintained at a negative pressure (about minus 0.5 kg/cm$^2$). This allows any microbubbles, that were introduced into the solution during the course of conveying it to the buffer, to escape. The negative pressure in the buffer during its refill and standby stages is generated by adding a venturi valve to the existing equipment. This keeps the impact on the control software to a minimum and has little or no effect on the cost of the process.

15 Claims, 6 Drawing Sheets

ELIMINATING MICROBUBBLES IN DEVELOPER SOLUTIONS TO REDUCE PHOTORESIST RESIDUES

BACKGROUND OF THE INVENTION (1) Field of the Invention

The invention relates to the general field of photoresist processing during integrated circuit manufacturing, more particularly to automatic dispensing of photoresist developer.

(2) Description of the Prior Art

In the course of manufacturing semiconductor integrated circuits, extensive use is made of photoresist for masking purposes. The photoresist, after exposure to ultraviolet light through a mask, needs to be developed. In a production environment there will be multiple stations at which photoresist can be developed as well as automatic delivery systems for supplying and dispensing developer solution, as it is needed.

We have observed, with the photoresist developer supply system that we have been using, that certain defects in the developed image may manifest themselves from time to time. Careful examination has revealed that these defects followed the direction of developer solution flow along the wafer surface from its point of dispensation. Further examination has shown that the defects arise from microbubbles in the developer solution. These microbubbles are introduced into the solution during its journey from the chemical room, where the developer is stored in bulk, to the buffer tanks in which the developer is held in readiness for demand by the dispensing stations.

Referring now to FIG. 1, we show there a schematic view of the flow system that we had previously used to bring the developing solution to the wafers. Main entrance pipe 3 is connected to the chemical room (not shown) through several tens of meters of piping. From 3, photoresist developer is directed to buffer tanks 1 and 2 whence they flow to two-way valve 4 which, under external control, directs the liquid to either of its outputs 5 and 6, each of which is connected to a separate dispensing unit. The symbol 'P in a circle' represents a diaphragm pump.

The sequence of events whereby alternate buffers are used as sources of photoresist developer is best followed by referring to FIGS. 2 and 3. Block 23 in FIG. 2 is marked as 'active' meaning that it is in process of sending liquid to two-way valve 4 (FIG. 1) The time for which it is active corresponds to the width of block 23 and is about 40 minutes. In synchrony with this, we have blocks 24 and 25 that relate to buffer 2. During the time corresponding to block 24, buffer tank 2 is connected to exhaust tank 13 through two-way valve 12. This brings the pressure in buffer 2 to zero (relative to atmospheric pressure) and allows developer solution to flow in from 3 and refill 2. When level sensor 32 signals that buffer 2 is full, valve 12 switches over to a source of inert gas (usually nitrogen) that is maintained at positive pressure (relative to atmosphere) with a view to minimizing possible oxidation of the developer in tank 2. Said positive pressure is then maintained for the period corresponding to block 25 when buffer 2 is said to be in standby mode.

Thus, except for the brief period corresponding to block 24, buffer 2 is always under a positive pressure of about 1 kg/cm.$^2$ This is reflected in FIG. 3 which shows pressure vs. time for the two tanks. During the time that buffer 1 is active (block 23 in FIG. 2) the pressure in it is about 1 kg/cm.$^2$ (curve 33 in FIG. 3). While buffer 2 is refilling (block 24 in FIG. 2) the pressure is reduced to zero (relative to atmospheric) (curve 36) but, once the tank has been filled, the pressure reverts to 1 kg/cm.$^2$ (curve 37) and remains there until it needs to be refilled once more (curve 38 and block 28).

A similar sequence of events, displaced in time so as to be exactly out of phase with tank 2's sequence, takes place for tank 1 (blocks 23, 26, and 27 in correspondence with curves 33, 34, and 35 respectively). Thus, one tank is always active while the other is being filled and then placed on standby status. In all cases, however, except for the brief period of refilling, the pressure in the tanks is positive and it is never negative.

SUMMARY OF THE INVENTION

It has been an object of the present invention to provide a method for storing and dispensing photoresist developer solution that is substantially free of microbubbles.

A further object of the present invention is to provide apparatus for implementing said method.

Another object of the present invention is that said method and apparatus require minimal modification of existing hardware and software.

A still further object of the present invention is that said method and apparatus have minimal effect on the present costs of automatically dispensing photoresist developer solution.

These objects have been achieved by providing an apparatus and method whereby the photoresist developer solution, while on standby status in a buffer tank, is maintained at a negative pressure (about minus 0.5 kg/cm$^2$), thereby allowing any micro-bubbles, that were introduced into the solution during the course of conveying it to the buffer, to escape. The negative pressure in the buffer during its refill and standby stages is generated by adding a venturi valve to the existing equipment. This keeps the impact on the control software to a minimum and has little or no effect on the cost of the process.

DESCRIPTION OF THE PREFERRED EMBODIMENTS

Figure 1:
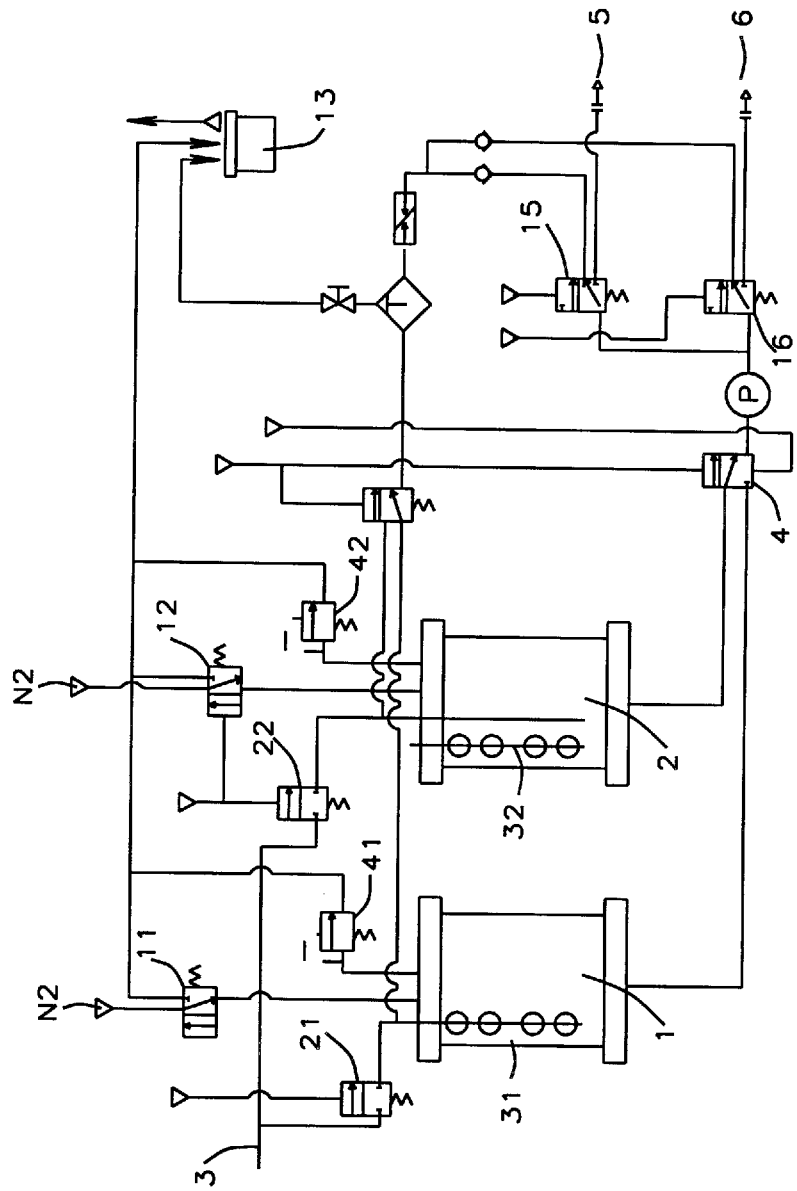
FIG. 1 is a diagram of the piping and associated control valves that we had been using to deliver photoresist developer to the developing stations prior to the present invention.
Figure 4:
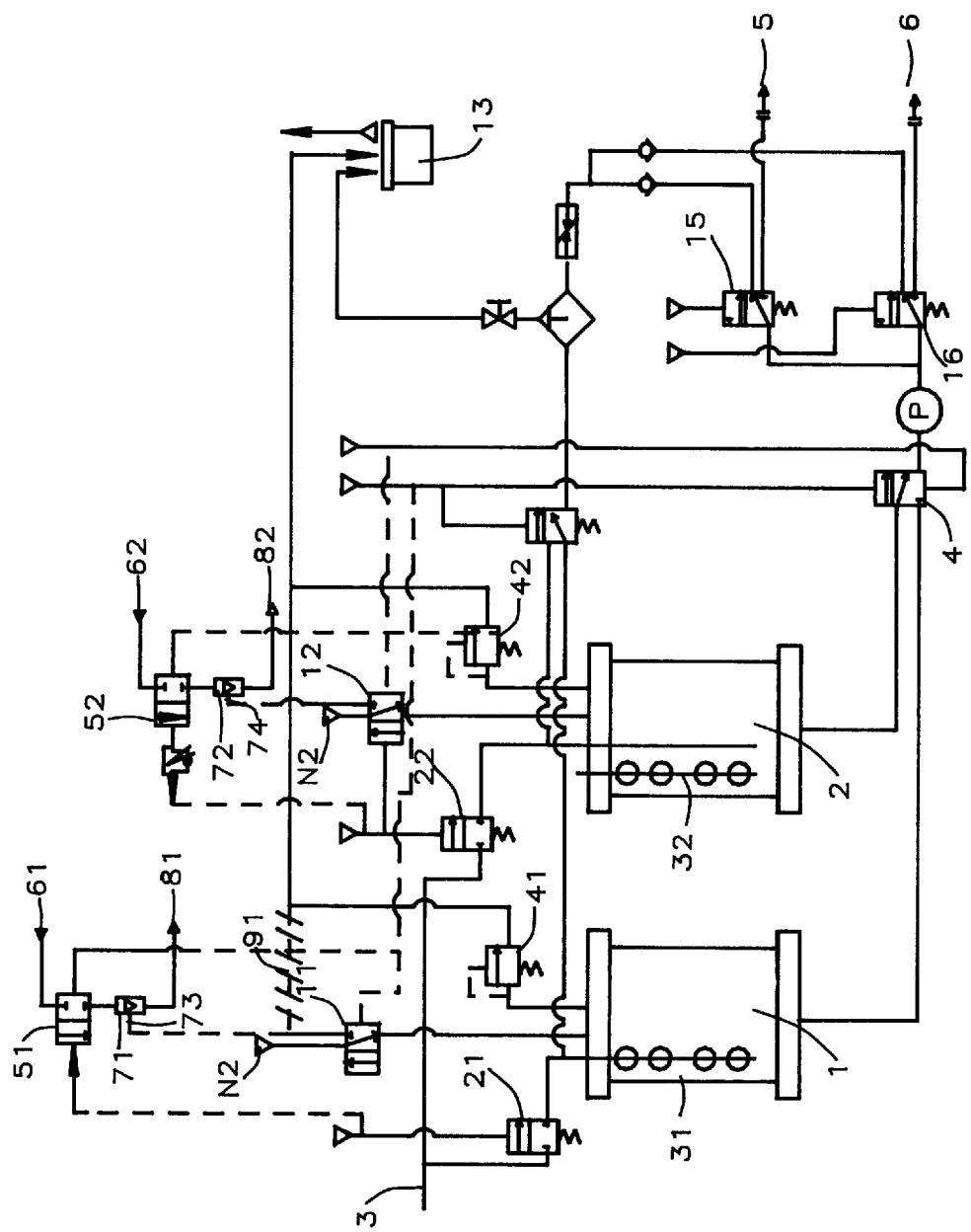
FIG. 4 is a diagram of the piping and associated control valves that employ the method of the present invention to deliver photoresist developer to the developing stations.

FIG. 4 illustrates the modifications to FIG. 1 that have been made and embody the present invention. New piping that has been added to the apparatus of FIG. 1 is shown as broken lines while a short length of piping 91 that has been removed from the apparatus of FIG. 1 is shown as a slashed line (--/--/--).

Of particular importance to note are the two venturi valves 71 and 72 which are connected to buffer tanks 31 and 32 through two-way valves 11 and 12 respectively. Each venturi valve is connected at one end (61 or 62) to a source of compressed air. Said compressed air is then allowed to flow at high speed past an aspirating arm (73 or 74), escaping at the other end (81 or 82). As a result of the well known Bernouilli effect, gas is sucked out of the aspirating arms resulting in the production of a negative pressure (pressure less than atmospheric) in the buffer tanks, as desired, by suitable adjustment of 11 or 12. Flow of compressed air through 71 and 72 is controlled by flow valves 51 and 52 respectively.

Figure 2:
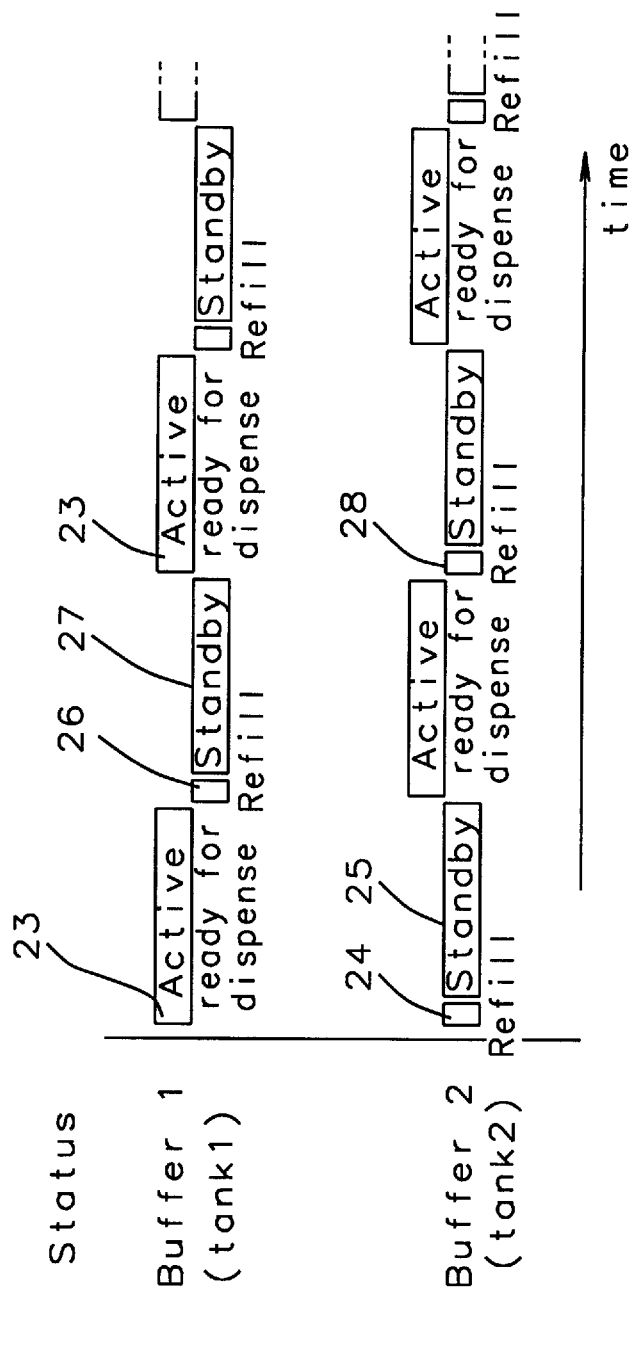
FIG. 2 is a diagram showing how the status of the two buffer tanks changes with time (pre-invention).
Figure 3:
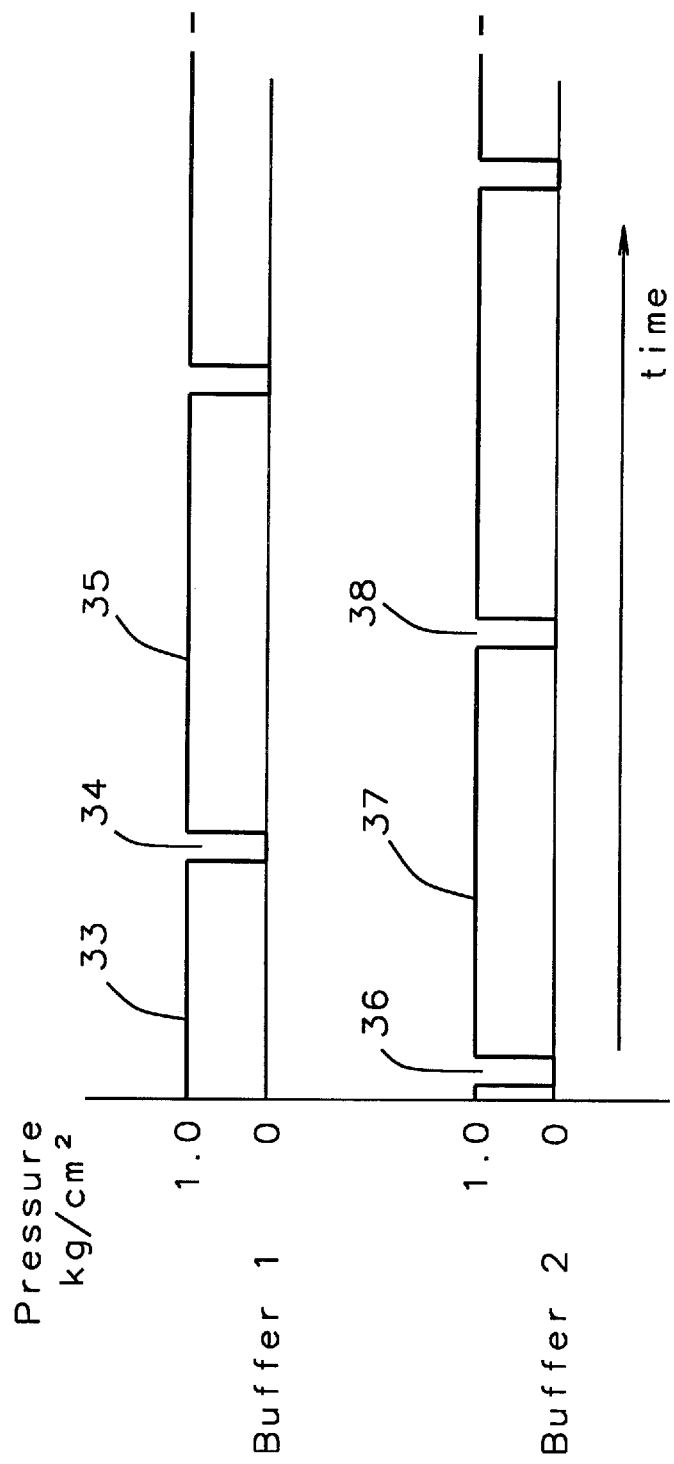
FIG. 3 is a diagram showing the pressure in each of the buffer tanks as a function of time (pre-invention).
Figure 5:
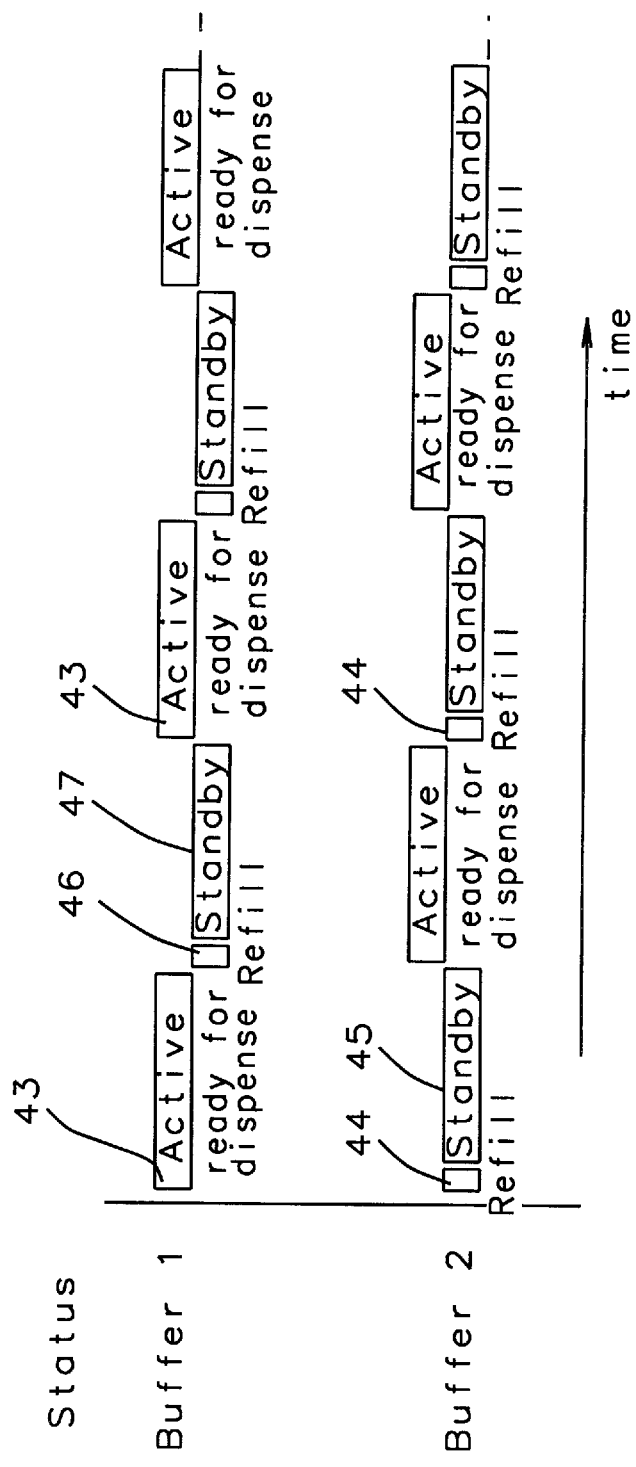
FIG. 5 is a diagram showing how the status of the two buffer tanks changes with time (post-invention).
Figure 6:
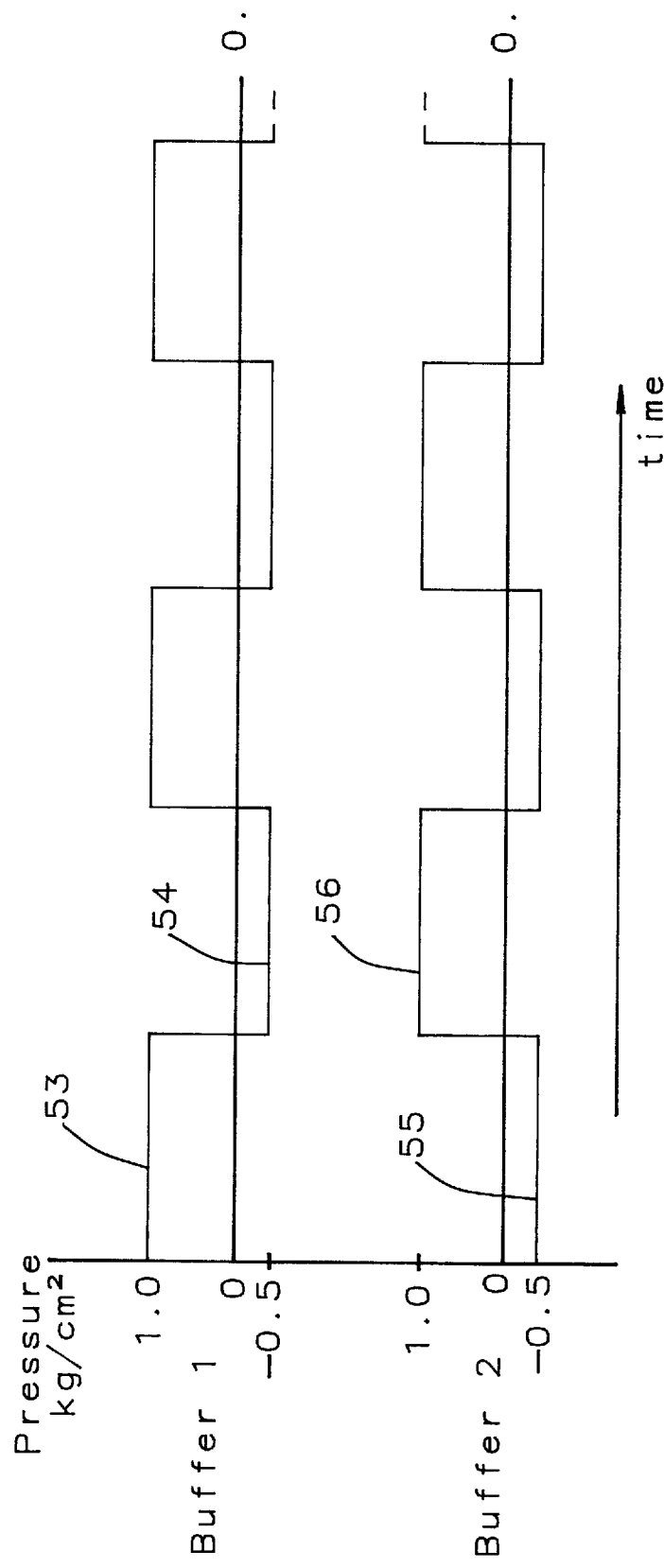
FIG. 6 is a diagram showing the pressure in each of the buffer tanks as a function of time (post-invention).

Addition of the two venturi valves and associated controls allows the duty and pressure cycles illustrated in FIGS. 5 and 6 respectively to be used in place of those seen earlier in FIGS. 2 and 3. The duty cycle shown in FIG. 5 is essentially equivalent to that shown in FIG. 2, that is the buffer tanks alternate with one another between being active 43 (that is, dispensing liquid) and being refilled 44 and then going on standy 45 in readiness for the next cycle.

The significance of the present invention is most clearly seen in the pressure vs. time diagram of FIG. 6. As can be seen, the sign of the pressure in the two tanks is always different from one another. That is, when there is a positive pressure such as 53 in one tank, the pressure 55 in the other tank is negative (below atmospheric). Similarly when the pressure 54 in the first tank in negative, the pressure 56 in the second tank is positive. Reference to the corresponding status blocks in FIG. 5 shows that the pressure in a given tank is positive, at between about 0.8 and 1.2 kg/cm.$^2$, while it is active but as soon as its status changes to refill and standby the pressure is reduced to between about −0.4 and −0.5 kg/cm.$^2$.

The sequence of events embodying the method of the present invention would thus be as follows:

We assume that buffer 1 is already filled with developer and is at active staus, buffer 2 having just been emptied by virtue of its having dispensed developer to one of the two developer stations. At the same time that buffer 1 begins its active status the pressure in buffer 2 is reduced as described above and, for a period of time between about 2 and 3 minutes, buffer 2 gets refilled (block 44 in FIG. 5). For the remainder of the time that buffer 2 is at standby status (between about 35 and 40 minutes) the negative pressure inside it is maintained.

The above sequence is now reversed—buffer 2 goes to active status while buffer 1 receives negative pressure which is maintained during both its refill and standby stages. The two buffer tanks continue to be switched between positive and negative pressures for as long as desired. In a typical operation this cycle would be repeated many times.

It is the reduction of the pressure on the developing solution to a negative value that is the key to the present invention. While the developer is in the buffer tank in standby status the reduced pressure to which it is exposed allows micro-bubbles suspended in it to rise to the surface faster than they otherwise would. Once they reach the surface the bubbles escape and are no longer present to act as potential defect sources introduced during photoresist development. The following data compares the incidence of defects introduced during development before and after the adoption of the method and apparatus of the present invention:

This method for improving the quality of the developed photoresist image is applicable to a wide range of photoresist developing solutions including NMD-W and NMD-3.

While the invention has been particularly shown and described with reference to the preferred embodiments thereof, it will be understood by those skilled in the art that various changes in form and details may be made without departing from the spirit and scope of the invention.

What is claimed is:

1. A method for dispensing photoresist developer comprising:

providing a buffer tank for temporary storage of the photoresist developer; and maintaining a negative pressure inside said buffer tank at all times other than when the tank is dispensing developer.

2. The method of claim 1 wherein said negative pressure is between about minus 0.4 and minus 0.5 kgm/cm$^2$.

3. A method for storing and dispensing photoresist developer, comprising the steps of:

(a) providing first and second buffer tanks for holding the photoresist developer;

(b) providing both tanks with a connection to a remote source of photoresist developer;

(c) filling the second tank with photoresist developer;

(d) for a first time period, partially exhausting the first buffer tank whereby a negative pressure is produced therein causing it to fill with photoresist developer;

(e) for a second time period, maintaining said negative pressure in the first tank, thereby allowing microbubbles suspended in the photoresist developer to escape;

(f) during said first and second time periods, providing a positive pressure of inert gas in the second buffer tank, thereby making it available for supplying photoresist developer to a dispensing unit;

(g) supplying photoresist from the second buffer tank to the dispensing unit on demand;

(h) then for a third time period, partially exhausting the second buffer tank whereby a negative pressure is produced therein causing it to fill with photoresist developer;

(i) then for a fourth time period, maintaining said negative pressure in the second tank, thereby allowing microbubbles suspended in the photoresist developer to escape;

(j) during said third and fourth time periods, providing a positive pressure of inert gas in the first buffer tank, thereby making it available for supplying photoresist developer to a dispensing unit;

(k) supplying photoresist from the first buffer to the dispensing unit on demand; and (l) repeating steps (d) through (k) a preset number of times.

4. The method of claim 3 wherein said inert gas is nitrogen.

5. The method of claim 3 wherein said negative pressure is between about minus 0.4 and minus 0.5 kgm/cm$^2$.

6. The method of claim 3 wherein said positive pressure is between about 0.8 and 1.2 kgm/cm$^2$.

7. The method of claim 3 wherein said first and third time periods are between about 2 and 3 minutes.

8. The method of claim 3 wherein said second and fourth time periods are between about 35 and 40 minutes.

9. An apparatus for storing and dispensing photoresist developer, comprising:

first and second sealed buffer tanks, each tank having a level sensor and an externally controlled inlet and outlet for photoresist developer;

a source of inert gas at positive pressure, connected, through control valves, to both buffer tanks; and first and second means for maintaining a negative pressure, independent of said inert gas source, connected, through control valves, to said first and second buffer tanks respectively.

10. The apparatus of claim 9 wherein said inert gas is nitrogen.

11. The apparatus of claim 9 wherein said negative pressure is between about minus 0.4 and minus 0.5 kgm/cm$^2$.

12. The apparatus of claim 9 wherein said positive pressure is between about 0.8 and 1.2 kgm/cm$^2$.

13. The apparatus of claim 9 wherein said externally controlled outlet for photoresist developer is connected to one of two photoresist developer dispensing units through a steering switch.

14. The apparatus of claim 9 wherein each said means for maintaining a negative pressure further comprises a venturi valve having an input connected to a source of compressed air, an exit for the compressed air, and an aspirating arm between said input and exit.

15. The apparatus of claim 9 wherein the photoresist developer is NMD-W or NMD-3.

* * * * *